United States Patent
Hiromi et al.

(10) Patent No.: US 8,470,128 B2
(45) Date of Patent: Jun. 25, 2013

(54) TRAY, TRAY SUPPORT MEMBER, AND VACUUM PROCESSING APPARATUS

(75) Inventors: Taichi Hiromi, Minamitsuru-gun (JP); Tadaaki Murakami, Fijinomiya (JP)

(73) Assignee: Canon Anelva Corporation, Kawasaki-shi (JP)

( * ) Notice: Subject to any disclaimer, the term of this patent is extended or adjusted under 35 U.S.C. 154(b) by 509 days.

(21) Appl. No.: 12/704,666

(22) Filed: Feb. 12, 2010

(65) Prior Publication Data
US 2010/0206484 A1 Aug. 19, 2010

(30) Foreign Application Priority Data

Feb. 16, 2009 (JP) ................................. 2009-033027
Feb. 8, 2010 (JP) ................................. 2010-025215

(51) Int. Cl.
- C23F 1/08 (2006.01)
- B65D 25/00 (2006.01)
- B65D 1/34 (2006.01)
- C23C 14/00 (2006.01)

(52) U.S. Cl.
USPC ........ 156/345.51; 206/557; 220/737; 118/50; 204/228.8

(58) Field of Classification Search
None
See application file for complete search history.

(56) References Cited

U.S. PATENT DOCUMENTS

| | | | |
|---|---|---|---|
| 4,895,107 A | 1/1990 | Yano et al. | |
| 6,868,302 B2 | 3/2005 | Kobayashi et al. | |
| 7,371,997 B2 | 5/2008 | Kobayashi et al. | |
| 2009/0255901 A1 | 10/2009 | Okita et al. | |
| 2010/0051584 A1 | 3/2010 | Okita et al. | |
| 2010/0206484 A1* | 8/2010 | Hiromi et al. | 156/345.51 |
| 2012/0256363 A1 | 10/2012 | Okita et al. | |

FOREIGN PATENT DOCUMENTS

| | | |
|---|---|---|
| JP | 05-013331 A | 1/1993 |
| JP | 09-202969 A | 8/1997 |
| JP | 2002043404 A | 2/2002 |
| JP | 2003-188245 A | 7/2003 |

(Continued)

OTHER PUBLICATIONS

Machine Generated English Translation of JP 2003-188245 published Jul. 4, 2003.*

(Continued)

*Primary Examiner* — Sylvia R Macarthur
(74) *Attorney, Agent, or Firm* — Fitzpatrick, Cella, Harper & Scinto (57) ABSTRACT

A vacuum processing apparatus includes a tray configured to hold a substrate, a tray support member including an arm configured to support the tray, and a holder to which the tray support member is attached. The arm includes a support portion which abuts against a lower portion of the tray, and a counterbore portion formed into a recessed shape below an edge of the tray such that the counterbore portion does not abut against the tray. When the tray is supported by the tray support member, an edge of an outer side surface of the tray is positioned above the counterbore portion and does not contact the tray support member, and the tray support member is configured to support the tray while pushing the tray against the holder. The tray is configured to form a space with the holder when pushed against the holder while holding the substrate and includes, on a side of the holder, a substantially ring-like projection configured to abut against the holder. The tray also includes an outer tray to be held by the tray support member, and an inner tray to be held by the outer tray, and when the outer tray is pushed against the holder, the inner tray alone abuts against the holder.

9 Claims, 4 Drawing Sheets

FOREIGN PATENT DOCUMENTS

| | | |
|---|---|---|
| JP | 2004-047911 A | 2/2004 |
| JP | 2007-109770 A | 4/2007 |
| KR | 20-0158382 | 7/1999 |

OTHER PUBLICATIONS

Machine Generated English Translation of JP 05-13331 published Jan. 22, 1993.*

Machine Generated English Translation of JP 2002-43404 published Feb. 8, 2002.*

Machine Generated English Translation of JP 09-202969 published May 8, 1997.*

Machine Generated English Translation of JP 2004-047911 published Feb. 12, 2004.*

Korean Office Action dated Nov. 22, 2011, in related Korean Patent Application No. 10-2010-0013551 (with English translation).

Korean Office Action dated Aug. 1, 2012, in related corresponding Korean Patent Application No. 10-2012-0053731 (with English translation).

Korean Notice of Allowance dated Aug. 20, 2012, in corresponding Korean Patent Application No. 10-2010-0013551.

Taiwanese Office Action dated Nov. 13, 2012, in related Taiwanese Patent Application No. 099104444 (with English translation).

* cited by examiner

A-A SECTION

TRAY, TRAY SUPPORT MEMBER, AND VACUUM PROCESSING APPARATUS

BACKGROUND OF THE INVENTION

1. Field of the Invention

The present invention relates to a tray and tray support member for performing vacuum processing such as thin film formation, surface modification, or dry etching, and a vacuum processing apparatus including the tray and tray support member. The present invention particularly relates to a tray and tray support member having a function capable of controlling the temperature of an object (substrate) to be processed while the object is held on the tray, and a vacuum processing apparatus including the tray and tray support member.

2. Description of the Related Art

Conventionally, a vacuum processing apparatus including a tray to be used to transfer an object (substrate) to be processed and capable of controlling the substrate held on the tray to a predetermined temperature by supplying a temperature transmission gas (heating gas) to a space on the back side of the substrate is known (see, for example, Japanese Patent Laid-Open No. 2002-43404).

The vacuum processing apparatus of Japanese Patent Laid-Open No. 2002-43404 is an apparatus that controls the temperature of a substrate by using the heating gas, and includes a tray having a closed space recess for supplying the heating gas to the space between the tray and the substrate. The substrate is fixed to the tray by using a pushing tool such that the surface opposite to the surface to be processed faces the closed space recess formed in the tray.

When the heating gas is supplied to the closed space recess in this state, the substrate can efficiently be heated via the sealed heating gas. That is, even when the interior of a vacuum vessel is set in a vacuum state in which the thermal conduction efficiency decreases, it is possible to greatly increase the accuracy and efficiency of the control of the substrate temperature by supplying the gas to only the closed space formed between the substrate and the tray.

On the other hand, the productivity of a vacuum processing apparatus can be increased by using a large-sized tray capable of holding a large number of substrates. However, if the large-sized tray capable of holding a number of substrates is used in the vacuum processing apparatus of Japanese Patent Laid-Open No. 2002-43404, the deformation of the tray caused by the temperature change is no longer negligible. That is, the warpage of the tray changes the tray set position and the like. This may induce an inconvenience such as a tray transport error, a nonuniform temperature distribution caused by the change in substrate position, or a leak of the heating gas. Accordingly, the size of the tray cannot be increased arbitrarily.

SUMMARY OF THE INVENTION

It is an object of the present invention to provide a tray and tray support member which increase the productivity by preventing the positional deviations of the tray and a substrate caused by warpage even when the size of the tray is large, and provide a vacuum processing apparatus including the tray and tray support member.

According to one aspect of the present invention, there is provided a vacuum processing apparatus comprising:

a tray configured to hold a substrate;

a tray support member including an arm configured to support the tray; and a holder to which the tray support member is attached, wherein the arm comprises a support portion which abuts against a lower portion of the tray, and a counterbore portion formed into a recessed shape below an edge of the tray such that the counterbore portion does not abut against the tray, and when the tray is supported by the tray support member, an edge of an outer side surface of the tray is positioned above the counterbore portion and does not contact the tray support member.

According to another aspect of the present invention, there is provided a vacuum processing apparatus comprising:

a tray configured to hold a substrate;

a tray support member comprising an arm configured to support the tray; and a holder positioned on a side opposite to a surface to be processed of the substrate to be supported by the tray, and configured to control a temperature, wherein the arm comprises a support portion which abuts against a lower portion of the tray, and a counterbore portion formed into a recessed shape below an edge of the tray such that the counterbore portion does not abut against the tray, and when the tray is supported by the tray support member, an edge of an outer side surface of the tray is positioned above the counterbore portion and does not contact the tray support member.

According to still another aspect of the present invention, there is provided a tray support member comprising an arm attached to a holder and configured to support a tray configured to hold a substrate, wherein the arm comprises a support portion which abuts against a lower portion of the tray, and a counterbore portion formed into a recessed shape below an edge of the tray such that the counterbore portion does not abut against the tray, and when the tray is supported by the arm, an edge of an outer side surface of the tray is positioned above the counterbore portion and does not contact the tray support member.

According to yet another aspect of the present invention, there is provided a tray to be supported from below by a tray support member attached to a holder positioned above the tray, and configured to hold a substrate, wherein the tray comprises an abutting portion which abuts against the tray support member, and an extending portion formed outside the abutting portion to extend such that the extending portion does not contact the tray support member.

The present invention can provide a tray and tray support member capable of preventing the warpage of the tray, thereby suppressing, for example, the change in tray position from a chuck and preventing inconveniences resulting from the change in tray position, and provide a vacuum processing apparatus including the tray and tray support member. The present invention can also provide a tray and tray support member which increase the productivity because the tray is a large-sized tray capable of holding a larger number of substrates, and can perform high-accuracy temperature control, and provide a vacuum processing apparatus including the tray and tray support member.

Further features of the present invention will become apparent from the following description of exemplary embodiments (with reference to the attached drawings).

DESCRIPTION OF THE EMBODIMENTS

An embodiment of the present invention will be explained below with reference to the accompanying drawings. Note that members, arrangements, and the like to be explained below are practical examples of the invention and hence do not limit the invention, so it is of course possible to variously change these factors in accordance with the spirit and scope of the invention.

First Embodiment

Figure 1:
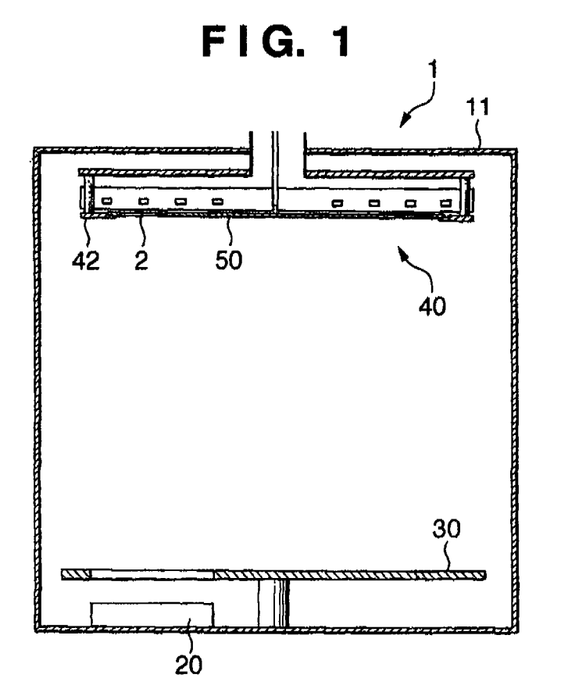
FIG. 1 is a schematic sectional view of a vacuum processing apparatus according to the first embodiment.
Figure 2:
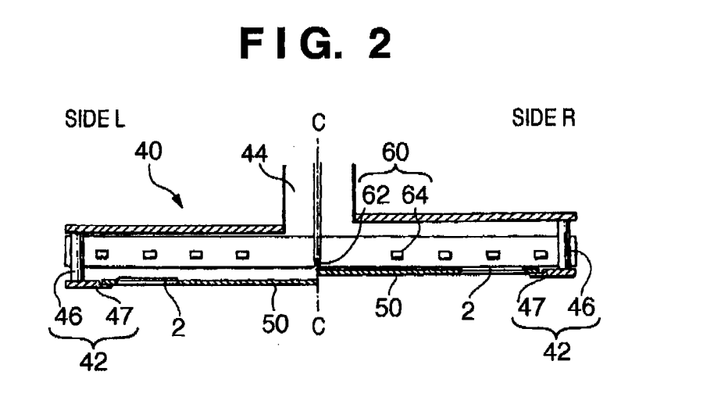
FIG. 2 is an enlarged schematic sectional view of a holder according to the first embodiment.
Figure 3A:
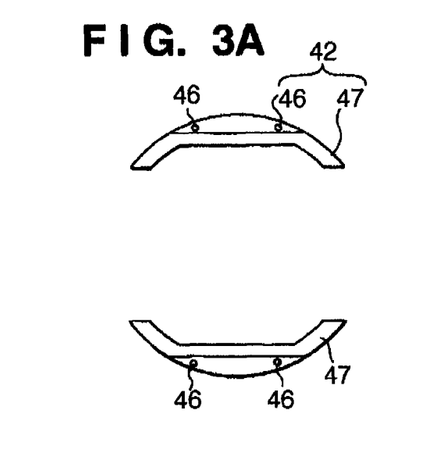
FIGS. 3A and 3B are front views of a tray and chucks according to the first embodiment.
Figure 3B:
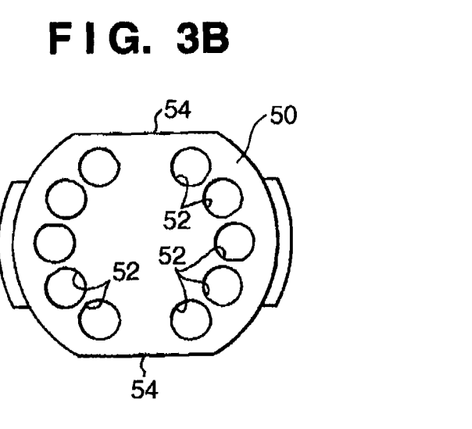
Figure 4:
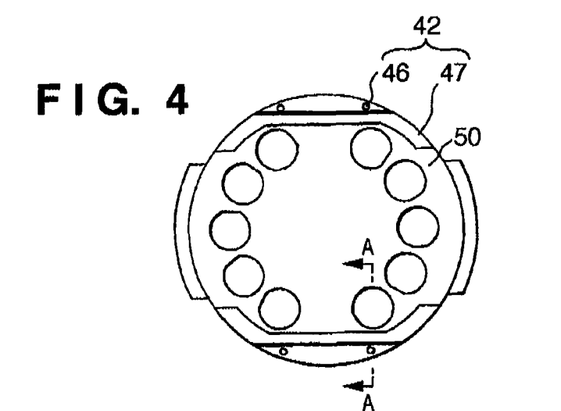
FIG. 4 is a front view of the state in which the tray according to the first embodiment is supported by the chucks.
Figure 5:
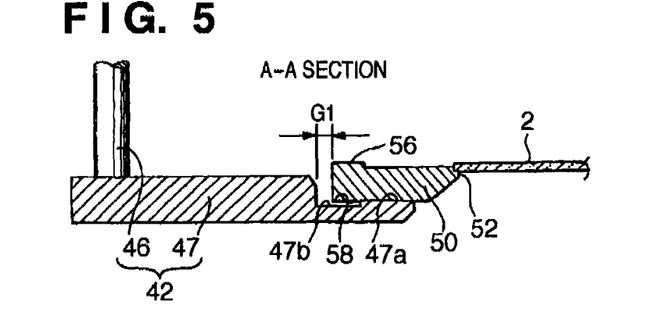
FIG. 5 is a sectional view taken along a line A-A in FIG. 4 according to the first embodiment.

FIGS. 1 to 5 are views for explaining a vacuum processing apparatus according to the first embodiment of the present invention. FIG. 1 is a schematic sectional view of the vacuum processing apparatus. FIG. 2 is an enlarged schematic sectional view of a holder. FIGS. 3A and 3B are front views of a tray and chucks. FIG. 4 is a front view of the state in which the tray is supported by the chucks. FIG. 5 is a sectional view taken along a line A-A in FIG. 4. Note that some portions are not shown in these drawings in order to avoid complicating them.

The vacuum processing apparatus according to the present invention is widely applicable to a sputtering deposition apparatus, thin film formation (a PVD apparatus) using an electron beam or the like, or vacuum processing such as surface modification or dry etching. In this embodiment, however, an example (vacuum processing apparatus 1) in which the vacuum processing apparatus is applied to a sputtering deposition apparatus will be explained.

The vacuum processing apparatus 1 will be explained below. As shown in FIG. 1, the vacuum processing apparatus 1 of this embodiment includes a vacuum vessel 1, sputtering means 20, shutter mechanism 30, and substrate holder (holder) 40 as main constituent elements. In addition, a tray 50 can be attached to the holder 40. Note that the holder 40 and sputtering means 20 are respectively arranged in the upper and lower portions of the sputtering apparatus 1, but the present invention is naturally also applicable to an arrangement in which the positions of the holder 40 and sputtering means 20 are switched.

The vacuum vessel 11 is an almost parallelepiped airtight hollow member made of stainless steel or an aluminum alloy generally used in a known sputtering apparatus. A load lock chamber (not shown) for loading and unloading substrates 2 (the tray 50) is connected to the side surface of the vacuum vessel 11 via a gate valve (not shown).

Also, an exhaust port (not shown) is formed near the bottom surface of the vacuum vessel 11. A vacuum pump such as a dry pump, cryo pump, or turbo molecular pump is connected to the exhaust port, and capable of evacuating the vacuum vessel 11 to about $10^{-5}$ to $10^{-7}$ Pa.

The sputtering means 20 includes, as main constituent elements, a sputtering cathode (not shown) installed in a predetermined position on the bottom surface of the vacuum vessel 11, and a target (not shown) having a material to be used in sputtering deposition. The shutter mechanism 30 includes a shutter plate for interrupting the movement of the deposited material produced from the sputtering means 20 toward the substrates, and a shutter plate driving control mechanism.

Since the sputtering means 20 and shutter mechanism 30 can be a known means and mechanism, details of these members will be omitted.

As shown in FIG. 2, the holder 40 is a table-like member capable of holding the substrates 2 so that they are supported by the tray 50 to face the sputtering means 20, and includes a heating mechanism 60 as a temperature control means for heating the substrates 2, and tray support members (chucks) 42 for holding the tray 50. The holder 40 is attached to a substrate rotating shaft 44 airtightly supported in the upper portion of the vacuum vessel 11 so as to be vertically movable and rotatable. Since the height adjusting mechanism and rotation control mechanism of the substrate rotating shaft 44 can be known mechanisms, details of these mechanisms will be omitted.

Referring to FIG. 2, the position of the chuck 42 on the left side (side L) of a line C is different from that on the right side (side R) of the line C. That is, in FIG. 2, side L shows the state in which the chuck 42 supports the tray 50 in a descended position, and side R shows the state in which the chuck 42 supports the tray 50 in an ascended position. When the chuck 42 supports the tray 50 in the ascended position, the biasing force of the chuck 42 pushes the tray 50 against the holder 40. The edges of the outer periphery of the tray 50 abut against the holder with a predetermined pressure.

The heating mechanism 60 includes a heating gas supply path 62, and a temperature controller having a heating device (heater 64). The heating gas supply path 62 is a gas supply pipe formed in the central portion of the holder 40. A heating gas supplied from a gas supply mechanism (not shown) is guided to the heating gas supply path 62 and supplied to the lower portion (opposite to the surface to be processed of the substrate) of the holder.

Note that an inert gas such as argon or helium is used as the heating gas. Referring to FIG. 2, one heating gas supply path 62 is formed in the center of the holder. In practice, however, many heating gas supply paths 62 are formed so as not to produce any gas distribution difference.

The temperature controller is integrated with the holder 40. In this embodiment, the temperature controller includes the heating device that is the heater 64 having an almost ring-like shape, a temperature sensor, and a control unit. By controlling the temperature of the holder 40 by adjusting the output from the heater 64, it is possible to conduct heat to the substrate 2 via the heating gas and control the temperature of the substrate 2.

The holder 40 includes a pair of chucks 42 so as to be able to support the tray 50 from the two sides. Each chuck 42 includes a vertically movable frame 46, and an arm 47 fixed to the frame 46 and extending toward the tray 50. The frame 46 is a rod-like member installed such that its axis is parallel to the direction of thickness (vertical direction) of the substrate 2. The frame 46 is attached to the holder 40 so as to be vertically slidable by a known mechanism.

As shown in FIG. 2, the arm 47 extends from the frame 46 toward the center of the holder 40 so as to be able to support the outer edge of the tray 50 from below. At the same time, as shown in FIG. 3A, the arm 47 has a certain length along the shape of the outer periphery of the tray 50.

Since the tray 50 is almost circular as will be described later, the arm 47 also has an almost circularly curved shape corresponding to the shape of the tray 50. Therefore, the arm 47 can abut against the tray 50 over a broad range, so the pair of arms 47 can reliably support the tray 50 from the right and left sides.

Note that in this embodiment, two frames 46 support one arm 47, and the pair of arms 47 are symmetrically arranged with respect to the central line of the holder 40. However, the present invention is not limited to this arrangement. For example, the chuck can also be constructed by supporting one arm having an almost U shape, C shape, or rectangular shape by one frame.

As shown in FIG. 3B, the tray 50 is an almost circular plate member, and has a large number of substrate mounting portions 52 each capable of holding the substrate 2 with the surface to be processed of the substrate 2 being exposed downward. Also, the tray 50 is made of stainless steel, copper, or a copper alloy. Two straight portions 54 are formed along the edges of the outer periphery of the tray 50. Positional deviation of the tray 50 in the direction of rotation is prevented by matching the straight portions 54 with the shape of the arms 47.

The substrate mounting portion 52 is formed as an opening slightly smaller than the substrate 2 so that the substrate 2 can be mounted by locking the edge of the outer periphery of the substrate 2.

As shown in FIG. 4, when the tray 50 is supported by the chucks 42, the tray 50 and chucks 42 can be integrated into a disk-like shape. When the tray 50 is attached to the holder 40, therefore, the heat capacity is not biased by the position of the tray 50, so a number of substrates 2 mounted on the tray 50 can be set at a uniform temperature.

FIG. 5 is a sectional view taken along a line A-A in FIG. 4. As described above, the substrates 2 are mounted on the substrate mounting portions 52 formed in the tray 50, and the tray 50 is supported by the arms 47 of the chucks 42. The arm 47 has a support portion 47a and counterbore portion (recessed portion) 47b. The support portion 47a directly abuts against the surface to be processed (facing the sputtering means 20) of the tray 50, and supports the tray 50.

The counterbore portion 47b is a recessed portion formed on that side of the support portion 47a which faces the frame 46. That side of the support portion 47a which faces the frame 46 is made lower than the support portion 47a by the counterbore portion 47b. This prevents the outer edge (an edge 58) on the same side as the surface to be processed of the tray 50 from contacting the arm 47. Although the support portion 47a and counterbore portion 47b are formed to have rectangular sectional shapes in this embodiment, they can also be formed to have trapezoidal shapes or semicircular shapes.

A gap G1 (predetermined distance) is formed on the side surface of the outer edge of the tray 50 in order to prevent the tray 50 from contacting the arm 47 or frame 46 when supporting the tray 50 by the chucks 42. Since the tray 50 and chucks 42 are spaced apart by the predetermined distance by the gap G1, it is possible to have clearance to horizontal dimensional changes (expansion) of the tray 50.

That is, even when the tray 50 thermally expands, it does not contact the chucks 42. This makes it possible to prevent the tray 50 from being bent (warped) by the pushing force from the chucks 42. It is also possible to prevent the chucks 42 from being broken by the stress caused by the expansion of the tray 50. Although the gap G1 can be an arbitrary dimension, it is decided by taking account of the thermal expansion coefficient of the tray 50.

Also, an almost ring-like projection 56 is formed on the outer periphery of the tray 50 on the side of the holder 40. When the tray 50 is pushed against the holder 40 by the chucks 42, the projection 56 comes in contact with the holder 40. Accordingly, a gap can be formed between the holder 40 and that surface (opposite to the surface to be processed) of the substrate 2 which faces the holder 40.

In addition, since the projection 56 is formed into a ring shape along the outer periphery of the tray 50, it is possible to form a space (closed space) surrounded by the projection 56, the surface of the holder 40 on the side of the substrate 2, the surface of the tray 50 on the side of the holder 40, and the surface of the substrate 2 on the side of the holder 40. The temperature of the substrate 2 can efficiently be controlled by supplying the heating gas to this space and sealing the gas in the space. Although the projection 56 is formed to have a rectangular sectional shape in this embodiment, it can also be formed to have a trapezoidal shape or semicircular shape.

The functions and effects of the above-mentioned arrangement will be described below.

When the substrates 2 are mounted on the tray 50 and the temperature is controlled (raised), the tray 50 warps. If the tray 50 expands toward the holder 40, the tray 50 abuts against the outside (on the side of the frame 46) of the support portion 47a. This is so because the counterbore portion 47b prevents the lower portion (edge 58) of the outer edge of the tray 50 from contacting the arm 47.

Accordingly, the warped portion of the tray 50 can be moved to the counterbore portion 47b. On the other hand, if the tray 50 expands toward the sputtering means 20 by the weight of the tray 50, the tray 50 abuts against the inside of the support portion 47a.

Since the counterbore portion 47b is formed, when the tray 50 warps and expands toward the holder 40, the tray 50 is supported in a middle position of the bend caused by the warpage. Therefore, a portion of the warpage amount of the tray 50 has no influence on the position of the substrate 2. Also, the total warpage amount of the tray 50 reduces because the tray 50 warps on the portion where the tray 50 is supported by the support portion 47a as a fulcrum. Accordingly, the support portion 47a is preferably formed to abut against the center of the tray 50 as much as possible.

The change in position of the tray 50 from the chuck 42 can be suppressed by preventing the warpage of the tray 50. Even when a large tray is used, therefore, it is possible to prevent a transfer error caused by a positional deviation when collecting the tray 50. It is also possible to prevent a nonuniform temperature distribution caused by, for example, a leak of the heating gas when the warpage of the tray 50 deviates the position of the substrate 2. It is of course also possible to suppress the decrease in deposition accuracy caused by the change in position of the substrate 2.

Note that the tray 50 according to this embodiment is supported from below by the support portions 47a of the arms 47. However, the same effects as those of the tray 50 of this embodiment can be obtained even when forming, on the tray 50, a projection (abutting portion) that abuts against the arms 47, instead of the support portions 47a. That is, it is possible to form a portion (abutting portion) projecting downward on the lower portion of the tray 50, and allow this abutting portion to abut against the arms.

Note that the abutting portion is preferably formed in the position where the support portion 47a in FIG. 5 is formed. When the abutting portion is thus formed slightly inside the outer edge of the tray, a portion (extending portion) extending outward to avoid contacting the arm 47 (tray support member) is formed outside the abutting portion, similar to the tray 50 shown in FIG. 5. In this structure, the arm 47 need not have the support portion 47a, or the height of the support portion 47a can be decreased.

Second Embodiment

Figure 6A:
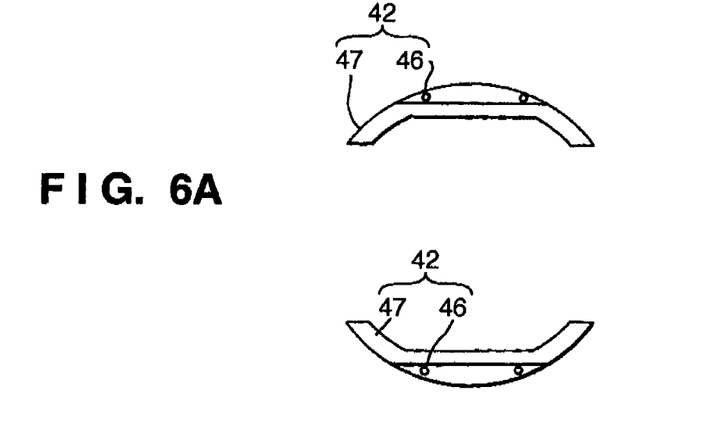
FIGS. 6A to 6C are front views of an inner tray, an outer tray, and chucks according to the second embodiment.
Figure 6B:
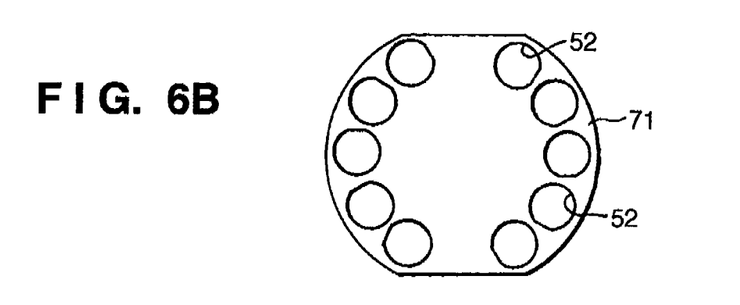
Figure 6C:
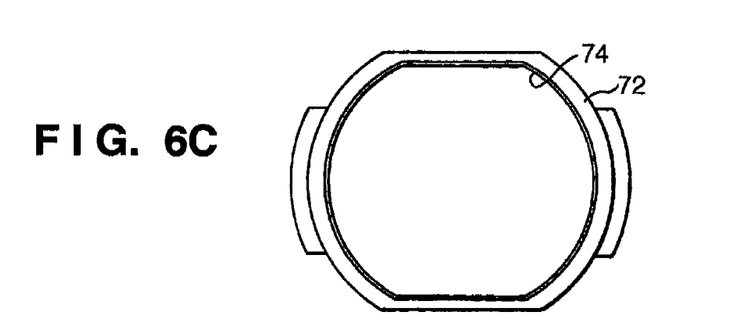
Figure 7A:
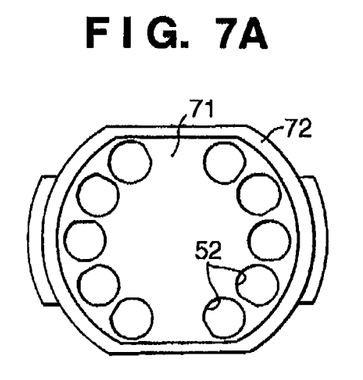
FIGS. 7A and 7B are front views of the state in which the inner tray according to the second embodiment is supported by the outer tray and chucks.
Figure 7B:
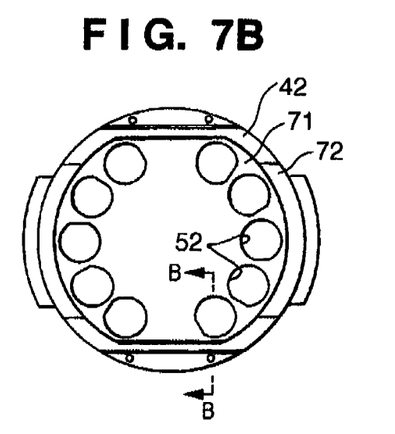
Figure 8:
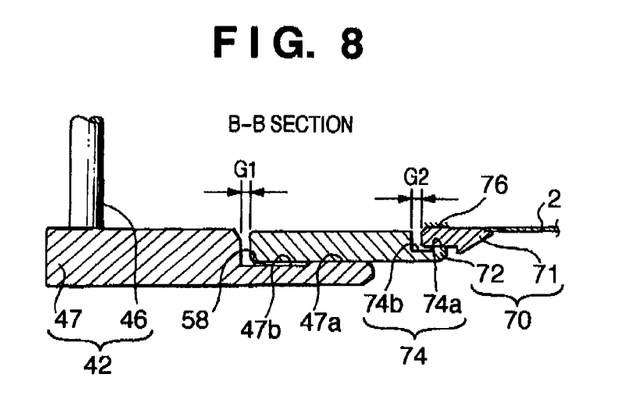
FIG. 8 is a sectional view taken along a line B-B in FIG. 7B according to the second embodiment.

FIGS. 6A to 6C, 7A, 7B, and 8 are views for explaining a vacuum processing apparatus according to the second embodiment of the present invention. FIGS. 6A to 6C are front views of a tray and chucks. FIGS. 7A and 7B are front views of the state in which the tray is supported by the chucks. FIG. 8 is a sectional view taken along a line B-B in FIG. 7B. Note that some portions are not shown in these drawings in order to avoid complicating them.

In the following embodiment, the same reference numerals denote, for example, the same members and arrangements as in the first embodiment, and a repetitive explanation will be omitted.

The vacuum processing apparatus according to this embodiment differs from that of the first embodiment in the structure of a tray.

A tray 70 of this embodiment is obtained by combining an inner tray 71 and outer tray 72.

As shown in FIG. 6B, the inner tray 71 is a disk-like member having a number of substrate mounting portions 52, and made of stainless steel, copper, a copper alloy, or an aluminum alloy.

As shown in FIG. 6C, the outer tray 72 is a frame-like member, and made of stainless steel or a copper alloy. A second arm 74 is formed throughout the entire inner periphery of the outer tray 72.

As shown in FIG. 7A, the inner tray 71 can be supported inside the outer tray 72 by putting the inner tray 71 on the second arm 74.

As shown in FIGS. 6A to 6C, 7A, 7B, and 8, substrates 2 are mounted on the substrate mounting portions 52 formed in the inner tray 71, and the inner tray 71 is supported inside the outer tray 72. The outer periphery of the outer tray 72 is supported by arms 47 of chucks 42.

The structure in which the inner tray 71 is supported inside the outer tray 72 is almost the same as the structure in which the chucks 42 support the tray 50 in the first embodiment. The second arm 74 has an inner support portion 74a and second counterbore portion 74b. The inner support portion 74a has the same function and effect as those of the support portion 47a. The second counterbore portion 74b has the same function and effect as those of the counterbore portion 47b.

A gap G2 is of course formed so that the inner tray 71 does not contact the outer tray 72 when supporting the inner tray 71 by the outer tray 72. Note that a projection 76 formed on the inner tray 71 has the same function as that of the projection 56 in the first embodiment. It is possible to form a space (closed space) surrounded by the projection 76, the surface of a holder 40 on the side of the substrate 2, the surface of the inner tray 71 on the side of the holder 40, and the surface of the substrate 2 on the side of the holder 40.

The functions and effects of the arrangement of the aforementioned second embodiment will be described below.

The function of supporting the outer tray 72 by the chucks 42 is the same as the effect of supporting the tray 50 by the chucks 42 in the first embodiment. Also, the effect of supporting the inner tray 71 inside the outer tray 72 is the same as the structure of supporting the tray 50 by the chucks 42 in the first embodiment.

That is, since the warpage of the tray can be reduced in the two portions, an effect larger than that of the tray 50 of the first embodiment can be expected. Therefore, it is possible to increase the productivity and reduce the manufacturing cost by applying the second embodiment to a larger tray capable of holding a larger number of substrates 2.

In the second embodiment, the outer tray 72 is formed into a ring shape. When the outer tray 72 warps and expands toward the holder 40, therefore, a fulcrum where the support portion 47a supports the warpage of the outer tray 72 can be an intermediate position of the width of the outer tray 72. The total warpage amount of the outer tray 72 can be minimized by the structure in which the outer tray 72 thus abuts against the support portion 47a in the intermediate position of the width of the outer tray 72.

Also, since the tray is divided into the inner tray 71 and outer tray 72, it is possible to decrease the strength of the inner tray 71, that is, decrease the thickness of the inner tray 71. Accordingly, the inner tray 71 can be made of copper, a copper alloy, or an aluminum alloy superior in thermal conduction to a stainless alloy. By forming the inner tray by using an aluminum alloy, copper, or a copper alloy superior in thermal conduction to a stainless alloy, it is possible to control the temperature with accuracy higher than that of the conventional apparatuses.

Note that the outer tray 72 according to this embodiment is supported from below by the support portions 47a of the arms 47. However, the same effect as that of the outer tray 72 of this embodiment can be obtained even when forming, on the outer tray 72, a projection (abutting portion) that abuts against the arms 47, instead of the support portions 47a. That is, it is possible to form a portion (abutting portion) projecting downward on the lower portion of the outer tray 72, and allow this abutting portion to abut against the arms.

Note that the abutting portion is preferably formed in the position where the support portion 47a in FIG. 8 is formed. When the abutting portion is thus formed slightly inside the outer edge of the outer tray 72, a portion (extending portion) extending outward to avoid contacting the arm 47 (tray support member) is formed outside the abutting portion, similar to the outer tray 72 shown in FIG. 8. In this structure, the arm 47 need not have the support portion 47a, or the height of the support portion 47a can be decreased.

Analogously, the inner tray 71 according to this embodiment is supported from below by the inner support portion 74a formed on the outer tray 72. However, the same effect as that of the inner tray 71 of this embodiment can be obtained even when forming, on the inner tray 71, a projection (abutting portion) that abuts against the outer tray 72, instead of the inner support portion 74a. That is, it is possible to form a portion (second abutting portion) projecting downward on the lower portion of the inner tray 71, and allow this abutting portion to abut against the outer tray 72.

The second abutting portion is preferably formed in the position where the inner support portion 74a is formed in FIG. 8. When the second abutting portion is thus formed slightly inside the outer edge of the inner tray 71, a portion (second extending portion) extending outward to avoid contacting the outer tray 72 is formed outside the second abutting portion, similar to the inner tray 71 shown in FIG. 8. In this structure, the outer tray 72 need not have the support portion 74a, or the height of the support portion 74a can be decreased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-033027, filed Feb. 16, 2009, Japanese Patent Application No. 2010-025215 filed Feb. 8, 2010, which are hereby incorporated by reference herein in their entirety.

What is claimed is:

1. A vacuum processing apparatus comprising:
    a tray configured to hold a substrate;
    a tray support member including an arm configured to support said tray; and
    a holder to which said tray support member is attached,
    wherein said arm comprises a support portion which abuts against a lower portion of said tray, and a counterbore portion formed into a recessed shape below an edge of said tray such that said counterbore portion does not abut against said tray, and
    when said tray is supported by said tray support member, an edge of an outer side surface of said tray is positioned above said counterbore portion and does not contact said tray support member, and
    wherein said tray support member is configured to support said tray while contacting said tray against said holder, and said tray is configured to form a space with said holder when contacted against said holder while holding the substrate, and
    said tray comprises, on a side of said holder, a substantially ring-like projection configured to abut against said holder,
    said tray comprises an outer tray to be held by said tray support member, and an inner tray to be held by said outer tray, and
    when said outer tray is pushed toward said holder, said inner tray alone abuts against said holder.

2. The processing apparatus according to claim 1, wherein said outer tray comprises a second arm configured to support said inner tray,
    said second arm comprises an inner support portion which abuts against a lower portion of said inner tray, and a second counterbore portion formed into a recessed shape below an edge of said inner tray such that said second counterbore portion does not abut against said inner tray, and
    when said inner tray is supported by said outer tray, an edge of an outer side surface of said inner tray is positioned above said second counterbore portion and does not contact said outer tray.

3. The processing apparatus according to claim 2, wherein said substantially ring-like projection is formed on said inner tray.

4. The processing apparatus according to claim 2, wherein said inner tray is made of a material selected from the group consisting of an aluminum alloy, copper, and a copper alloy.

5. A vacuum processing apparatus comprising:
    a tray configured to hold a substrate;
    a tray support member including an arm configured to support said tray; and
    a holder to which said tray support member is attached,
    wherein said arm comprises a support portion which abuts against a lower portion of said tray, and a counterbore portion formed into a recessed shape below an edge of said tray such that said counterbore portion does not abut against said tray, and
    when said tray is supported by said tray support member, an edge of an outer side surface of said tray is positioned above said counterbore portion and does not contact said tray support member,
    and said tray comprises, on a side of said holder and at its outer periphery, a substantially ring-like projection configured to abut against said holder.

6. A processing apparatus according to 5, wherein
    said tray comprises an outer tray to be held by said tray support member, and an inner tray to be held by said outer tray, and
    when said outer tray is pushed toward said holder, said inner tray alone abuts against said holder.

7. The processing apparatus according to claim 6, wherein said outer tray comprises a second arm configured to support said inner tray,
    said second arm comprises an inner support portion which abuts against a lower portion of said inner tray, and a second counterbore portion formed into a recessed shape below an edge of said inner tray such that said second counterbore portion does not abut against said inner tray, and
    when said inner tray is supported by said outer tray, and an edge of an outer side surface of said inner tray is positioned above said second counterbore portion and does not contact said outer tray.

8. The processing apparatus according to claim 7, wherein said substantially ring-like projection is formed on said inner tray.

9. The processing apparatus according to claim 7, wherein said inner tray is made of a material selected from the group consisting of an aluminum alloy, copper, and a copper alloy.

* * * * *